United States Patent
Inoue et al.

[11] Patent Number: 6,146,920
[45] Date of Patent: Nov. 14, 2000

[54] BUMP FORMATION METHOD

[75] Inventors: Kosuke Inoue, Yokohama; Tatsuya Yoneda, Kodaira; Takamichi Suzuki, Yokohama; Ryosuke Kimoto, Hamura; Junichi Suzuki, Ome, all of Japan

[73] Assignees: Hitachi, Ltd.; Hitachi Tokyo Electronics Co., Ltd; Hitachi ULSI Systems, Co., Ltd., all of Tokyo, Japan

[21] Appl. No.: 09/113,183

[22] Filed: Jul. 10, 1998

[30] Foreign Application Priority Data

Jul. 11, 1997 [JP] Japan ..................................... 9-186243

[51] Int. Cl.$^7$ ........................... H01L 21/44; H01L 21/48; H01L 21/50
[52] U.S. Cl. .......................... 438/113; 438/119; 438/458; 438/460; 438/464
[58] Field of Search ..................................... 438/113, 119, 438/458, 460, 464

*Primary Examiner*—John F. Niebling
*Assistant Examiner*—David A Zarneke
*Attorney, Agent, or Firm*—Antonelli, Terry, Stout & Kraus, LLP

[57] ABSTRACT

A method for forming bumps in an LSI package in which: semiconductor chips are mounted onto a flexible printed circuit board; electrically conductive balls are temporarily fixed by using a fixing liquid including one selected from a group including flux, solder paste and an adhesive containing an electrically conductive agent, onto pads which are provided on the flexible printed circuit board so as to be electrically connected to the semiconductor chips; the flexible printed circuit board having the electrically conductive balls temporarily fixed thereto is wound up onto a reel; the flexible printed circuit board having the electrically conductive balls temporarily fixed thereto is fed out from the reel and heated to thereby form bumps thereon; and the flexible printed circuit board having the bumps formed thereon is wound up onto another reel; and the flexible printed circuit board is cleansed and trimmed to thereby form LSI packages.

11 Claims, 6 Drawing Sheets

BUMP FORMATION METHOD

BACKGROUND OF THE INVENTION

The present invention relates to a method for forming connection protrusions called "bumps" by mounting electrically conductive balls represented by solder balls or gold spheres onto a package such as a BGA (ball grid array) package, a CSP (chip size package or chip scale package), etc., of the type (hereinafter simply referred to as "package") in which solder balls are used as a bonding material for bonding the package to a mounting substrate, among various LSI packages.

In a recent LSI package substrate, or the like, used in an LSI having a large number of input/output terminals, there is employed a structure in which a plurality of electrical terminals arranged in the form of a grid or a zigzag grid are provided on a lower surface of the LSI package substrate, and the electrical terminals are connected by bumps to circuit electrodes of circuit boards corresponding to the electrical terminals.

A solder bump formation method is disclosed in JP-A-8-115916, JP-A-9-063737, etc. Those publications disclose: a technique for forming solder bumps by vacuum-sucking solder balls by means of an adsorbing jig, dipping the solder ball into a flux liquid tank to thereby supply flux to the solder balls, transferring the solder balls onto pads (connection terminals) formed on an LSI package substrate, and heating (reflowing) an electronic circuit substrate containing the solder balls tackily held (temporarily fixed) by tacking force of the flux; an apparatus for mounting solder balls onto an LSI package substrate. The heating may be carried out by using a reflow furnace available on the market.

The conventional method, however, has the following problems.

Figure 12:
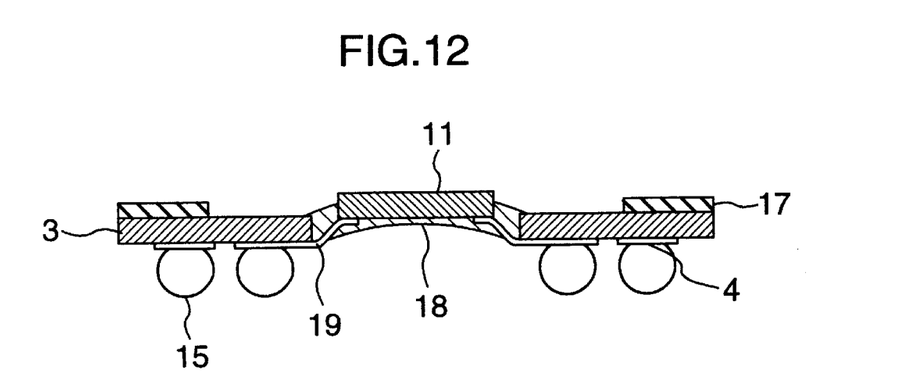
FIG. 12 is a view showing an example of an LSI package using the flexible printed circuit board.

A flexible printed circuit board such as a flexible tape has been used widely as the LSI package substrate recently. FIG. 12 shows an example of an LSI package using such a flexible printed circuit board. In FIG. 12, the reference numeral 3 designates a flexible printed circuit board; 15, solder bumps; 4, pads on which the solder bumps 15 are formed; 11, a semiconductor chip; 19, leads for connecting the pads 4 to the semiconductor chip 11; 18, an encapsulation resin for fixing the semiconductor chip 11 to the flexible printed circuit board 3; and 17, a quadrate reinforcement plate.

In the case of an LSI package using the aforementioned flexible printed circuit board, the LSI package substrate is trimmed into small pieces shaped like strips in advance before formation of bumps to make it possible to use a conventional manufacturing apparatus for a rigid printed circuit board. The LSI package substrate is further trimmed into minimum pieces in the final step of LSI packaging after bump formation. Thus, two steps are required for trimming. Accordingly, there arises a problem that the cost for bump formation is high.

Further, in order to put the strips of LSI package substrate into a ball mounter or a heating reflow furnace, which is an apparatus for mounting solder balls onto the LSI package substrate, it is necessary to make the handling easy by fixing the package substrate, which is low in rigidity and hard to handle, to an exclusive-use carrying jig which is high in rigidity. High dimensional accuracy is required in the exclusive-use carrying jig, so that the fixing of the LSI package substrate to the exclusive-use carrying jig is mainly performed by hand work. As described above, conventionally, not only a number of expensive exclusive-use carrying jigs are prepared in accordance with the number of products but also strips of LSI package substrate are fixed to the exclusive-use carrying jigs. Accordingly, there arises a problem that the cost for bump formation is high.

To solve the aforementioned problems, it is thought of that the solder ball mounter 14 and the reflow furnace are remodeled to make it possible to supply a tape-like LSI package substrate continuously, and then the solder ball mounter and the reflow furnace are integrated with each other, so that the LSI package substrate after completion of mounting of solder balls is put into the reflow furnace directly to thereby eliminate the exclusive-use carrying jigs and the substrate trimming steps for bump formation.

In this method, however, when a trouble occurs in the solder ball mounter for mounting solder balls so that the apparatus stops, it is difficult to prevent the damage of the LSI package substrate exposed to a high temperature in an in-process state in the reflow furnace. Further, though it is general that the time required for mounting solder balls varies in accordance with the presence/absence of a retry operation, or the like, the change of the heating time leads to the change of the total amount of heat energy received by semiconductors connected to the solder balls and the LSI package substrate and, accordingly, it causes failures in bump formation. Accordingly, the change of the heating time in bump formation is not permitted, so that the integration of the solder ball mounter and the reflow furnace is unreasonable from the two apparatuses' characters and cannot be achieved at present.

The present invention is intended to realize a bump formation method in which the aforementioned problems are solved and the exclusive-use carrying jigs and the substrate trimming steps for bump formation are made unnecessary with respect to a tape-like LSI package substrate.

SUMMARY OF THE INVENTION

An object of the present invention is to provide a bump formation method in which bumps can be formed on a semiconductor substrate by a simple structure and by a simple assembling means.

Another object of the present invention is to provide a bump formation method which is excellent in reliability on formation of bumps on a semiconductor substrate.

A further object of the present invention is to provide a bump formation method in which bumps can be formed on a semiconductor substrate inexpensively.

In order to achieve the aforementioned objects, it is designed that a tape-like LSI package substrate is fed from a reel into a solder ball mounter, and the substrate is temporarily wound up onto the reel after solder balls have been mounted on the substrate. The tackiness of a fixing liquid such as flux, or the like, used for mounting the solder balls onto the substrate is selected to be larger than a value of the product of the mass of the solder balls and the acceleration received by the solder balls during carrying the substrate so that the solder balls mounted and temporarily fixed on the substrate are prevented from dropping. Further, when the tape-like LSI package substrate is wound up onto the reel, a spacer is involved in the windings of the substrate to prevent mechanical contact so that the solder balls mounted and temporarily fixed to the substrate are not displaced because of the mechanical contact.

According to the present invention, the formation of bumps on a tape-like flexible printed circuit board widely used as an LSI package substrate can be achieved inexpensively without using any trimming step for forming bumps and without using any exclusive-use carrying jig. In addition, remodeling of the general-use solder ball mounter and the general-use reflow furnace can be minimized.

DESCRIPTION OF THE PREFERRED EMBODIMENTS

Embodiments of the present invention will be described below in detail with reference to the drawings. In the drawings, the same or equivalent reference numerals are to used to refer to the same or equivalent parts to thereby avoid duplicated description about those parts. Although the bump formation method will be described in the case where solder balls are used as an example of electrically conductive balls, and flux as an example of a fixing liquid, it is a matter of course that the bump formation method is not limited to this combination, but that balls such as metal spheres or spheres coated with electrically conductive materials other than the solder balls may be used as the electrically conductive balls. Further, solder paste or an electrically conductive adhesive agent may be used as a fixing liquid substituted for the flux.

Figure 1:
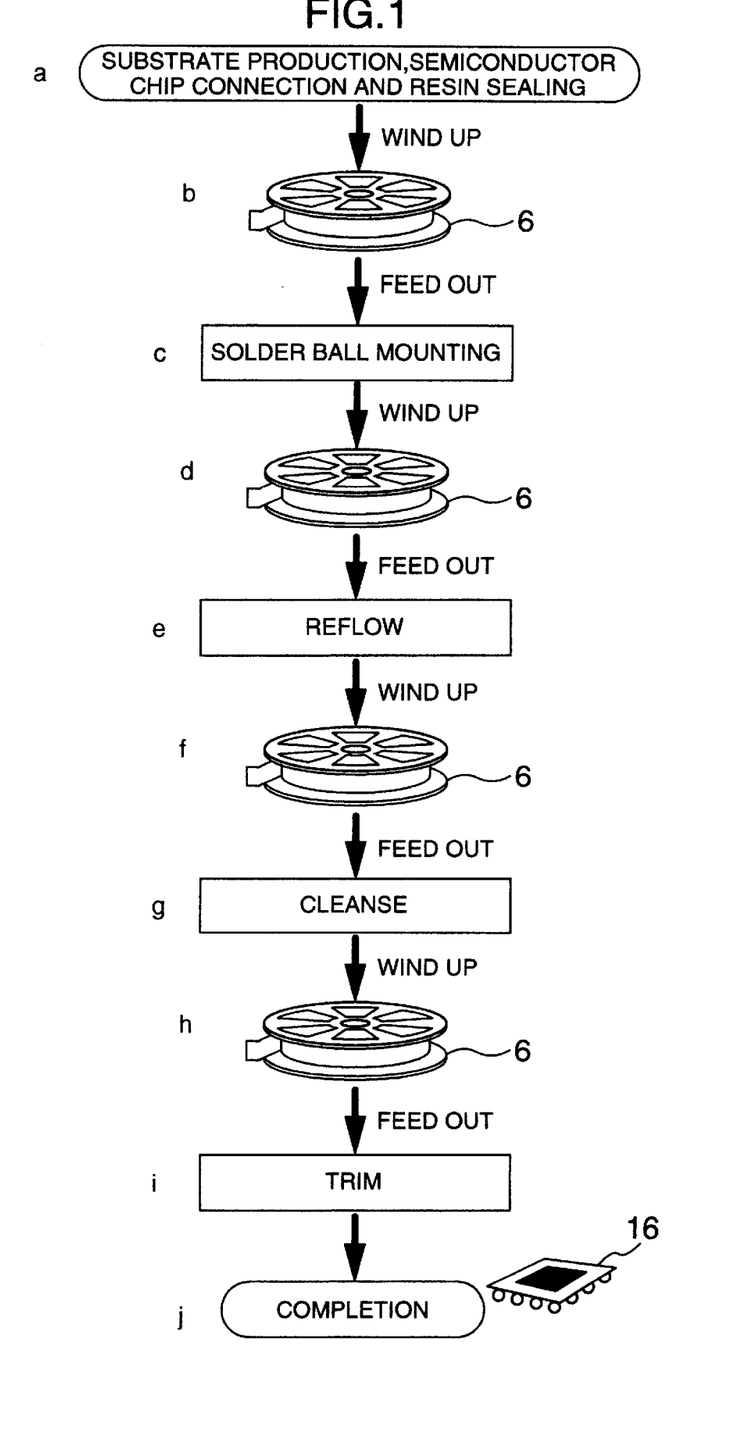
FIG. 1 is a flow chart showing bump formation according to the present invention.

FIG. 1 is a view showing the basic flow of the bump formation method according to the present invention. In FIG. 1, the reference numeral 6 designates a substrate takeup reel on which a flexible printed circuit board for forming LSI packages after trimming in a final step is wound up; and 16, an LSI package. First, in the step a, semiconductor chips are bonded to the flexible printed circuit board and sealed with resin. Succeedingly, the flexible printed circuit board is wound up onto the substrate takeup reel 6 as shown in the step b. Then, in the step c, the flexible printed circuit board is fed out from the substrate takeup reel 6 and solder balls are mounted onto the flexible printed circuit board. The flexible printed circuit board after mounting of the solder balls is wound up onto the substrate takeup reel 6 as shown in the step d. Then, in the step e, the flexible printed circuit board after mounting of the solder balls is fed out from the substrate takeup reel 6 and then heated. By heating and cooling, bumps are formed on the flexible printed circuit board. The flexible printed circuit board is then wound up onto the substrate takeup reel 6 as shown in the step f. Thereafter, the flexible printed circuit board is cleansed and trimmed to complete LSI packages 16. Incidentally, the flexible printed circuit board may be cleansed under the condition that the flexible printed circuit board has been wound up on the substrate takeup reel 6 or the flexible printed circuit board may be cleansed after the flexible printed circuit board has been fed out from the substrate takeup reel 6. Further, as a customer's demands, the flexible printed circuit board may be shipped under the condition that the flexible printed circuit board has been wound up on the substrate takeup reel 6 without being trimmed. In this case, the flexible printed circuit board may be trimmed on the customer side as occasion demands.

Figure 2:
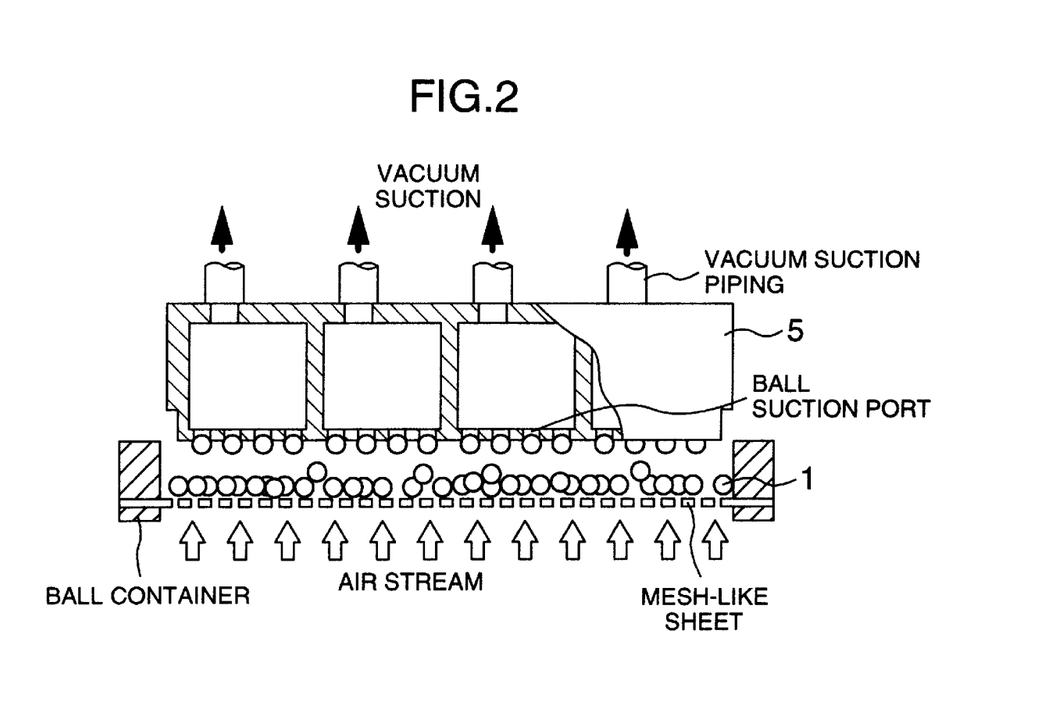
FIG. 2 is a partly sectional view showing a method for vacuum-sucking solder balls to a mounting head.
Figure 3:
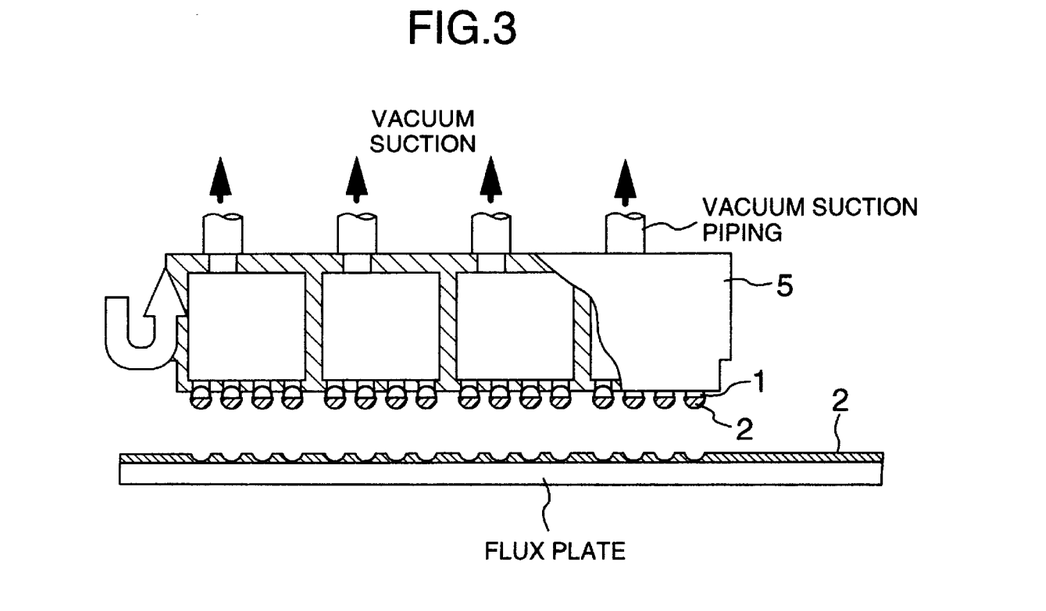
FIG. 3 is a partly sectional view showing a method for supplying flux to the solder balls vacuum-sucked to the mounting head.
Figure 4:
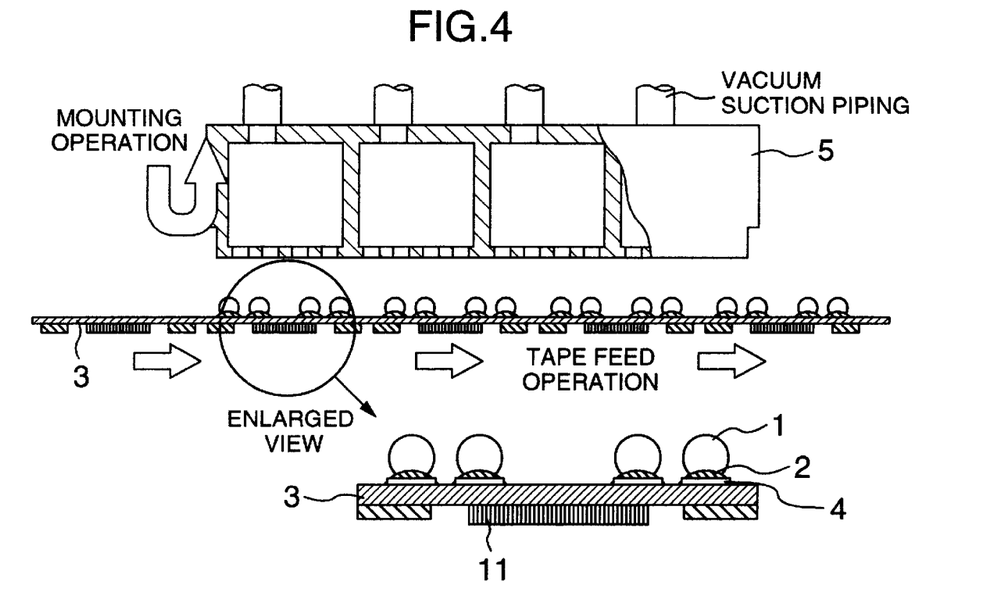
FIG. 4 is a partly sectional view showing a method for mounting solder balls onto a flexible printed circuit board.

The flow shown in FIG. 1 will be described below more in detail. FIGS. 2 through 4 show a solder ball mounting method shown in the step c in FIG. 1. In the drawings, the reference numeral 1 designates solder balls; 2, flux; 3, a flexible printed circuit board; 4, pads formed on the flexible printed circuit board; 5, a mounting head; and 11, semiconductor chips.

FIG. 2 shows a method for supplying the solder balls 1 to the mounting head 5. The solder balls 1 are received in a ball container having a bottom formed as a mesh-like sheet. The solder balls 1 are blown up by an updraft air stream through the mesh-like sheet. The mounting head 5 is located above the ball container. The solder balls 1 are vacuum-sucked to a large number of ball suction ports.

FIG. 3 shows a method for supplying flux to the vacuum-sucked solder balls 1. The flux 2 is applied and spread on a flux plate in advance. The mounting head 5 having the solder balls 1 vacuum-sucked thereto closely comes into contact with a flux surface on the flux plate. As a result, the flux 2 is supplied to the solder balls 1.

FIG. 4 shows a method for mounting the solder balls 1 onto the flexible printed circuit board 3. The mounting head 5 having the solder balls 1 vacuum-sucked thereto comes close to the flexible printed circuit board 3 having the semiconductor chips 11 bonded thereto. As a result, the solder balls 1 are pressed against the flexible printed circuit board 3. Vacuum suction is cut off and the solder balls 1 are opened to the atmospheric pressure or supplied with positive pressure, so that the solder balls 1 are mounted onto the pads 4 on the flexible printed circuit board 3 by the tackiness of the flux 2. Incidentally, in the case where there is a fear that the solder balls 1 cannot be correctly mounted onto the pads 4, pins for pushing out the solder balls 1 and mechanisms for pushing out the pins may be provided in the inside of the mounting head 5 so that mounting of the solder balls 1 can be achieved surely by use of the pins and mechanisms.

Supply of the flux 2 may be performed by application of a general screen printing method or a pin transfer method onto the pads 4 or by use of dispensing, before mounting of the solder balls 1. As the flux 2, flux having tackiness larger than a value which is a product of the mass of the solder balls 1 and the acceleration which would be applied to the flexible printed circuit board 3 after the solder balls 1 have been mounted onto the flexible printed circuit board 3 must be used so that the solder balls 1 do not drop off by shocks during carrying thereafter, careless handling, etc. Though the necessary value of tackiness of the flux varies in accordance with the apparatus used and the size of the solder balls, under general circumstances, the solder balls can be entirely prevented from dropping off if the value is selected to be not smaller than 100 gf. Incidentally, the tackiness of the flux 2 may be measured by a paste tackiness testing machine, for example, made by MALCOM Co., Ltd.

Figure 10:
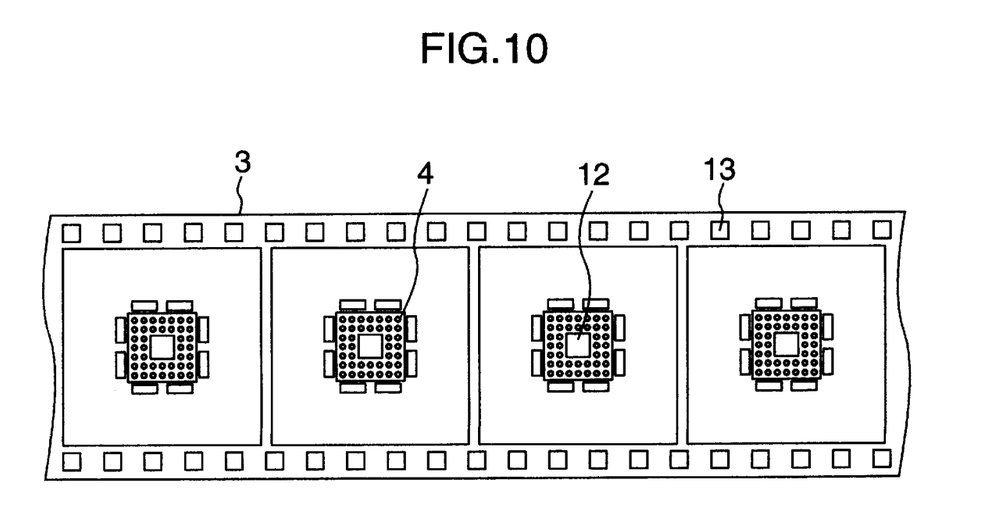
FIG. 10 is a view showing an example of the flexible printed circuit board.
Figure 11:
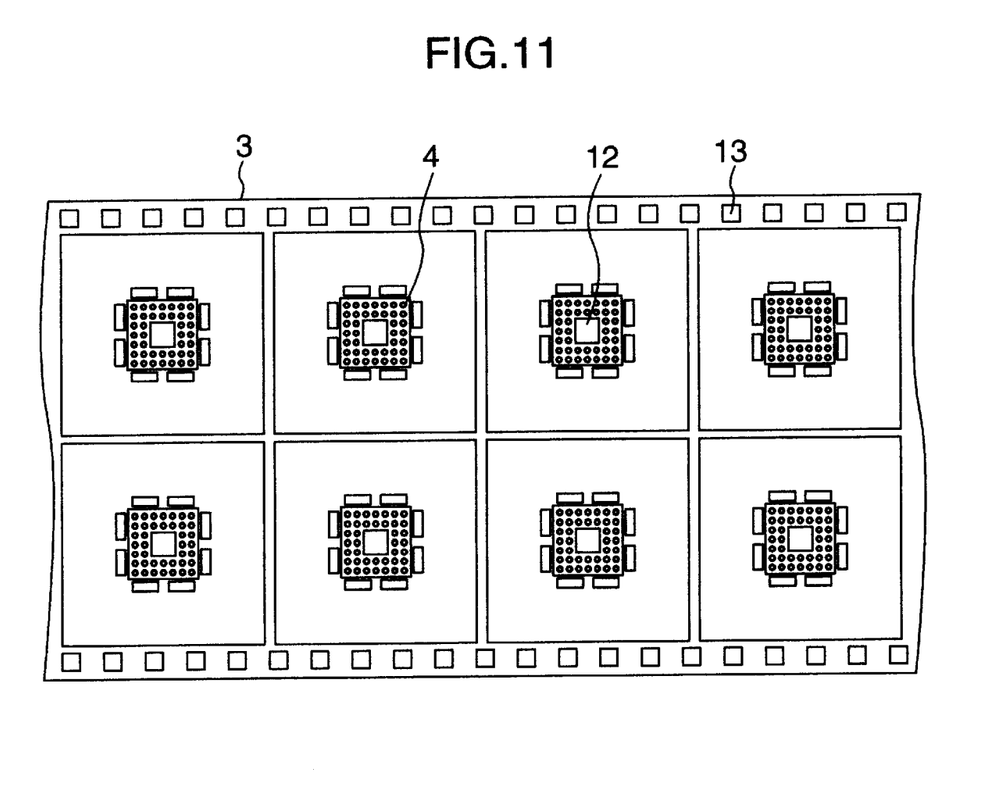
FIG. 11 is a view showing another example of the flexible printed circuit board.

FIGS. 10 and 11 show the flexible printed circuit board 3 in this embodiment. The flexible printed circuit board 3 is formed of a material such as a polyimide film, or the like, which is excellent both in heat resistance and electrical insulation. Metal circuits and pads 4 are formed on the material. The reference numeral 12 designates semiconductor chip bonding portions; and 13, perforations used for feeding the flexible printed circuit board 3. FIG. 10 shows the case where one semiconductor chip bonding portion 12 is disposed in the direction of the width of the flexible printed circuit board 3. FIG. 11 shows the case where two semiconductor chip bonding portions 12 are disposed in the direction of the width of the flexible printed circuit board 3.

Figure 5:
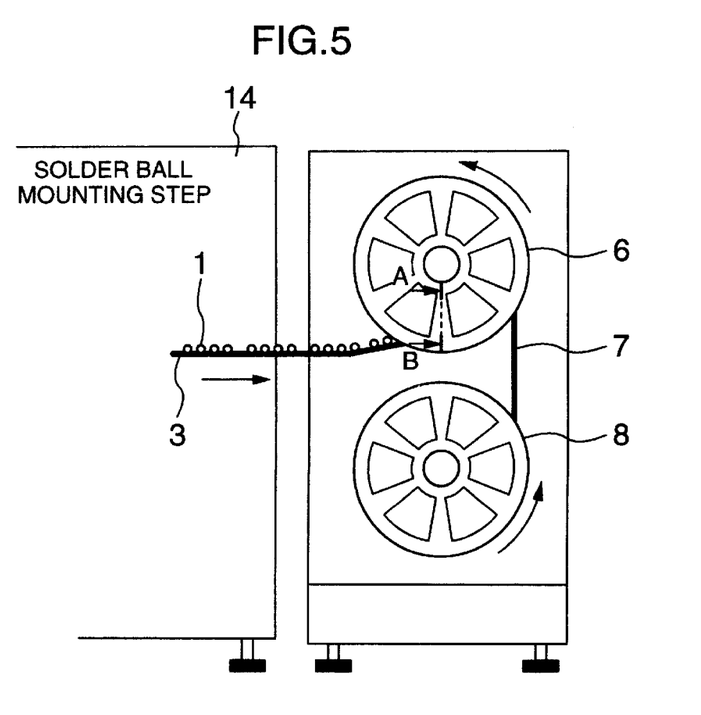
FIG. 5 is a view showing a method for winding up the flexible printed circuit board after the solder balls have been mounted on the flexible printed circuit board.
Figure 6:
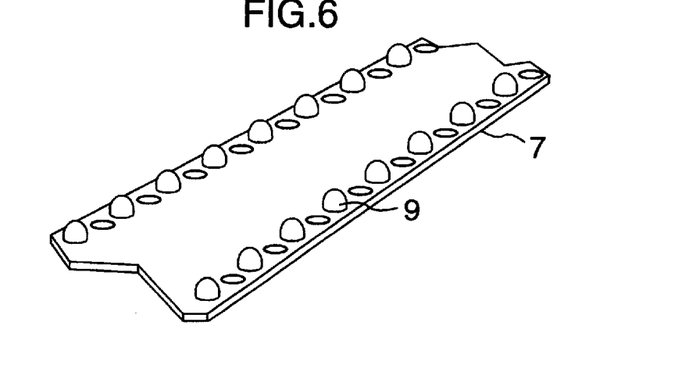
FIG. 6 is a perspective view showing a part of a spacing tape.
Figure 7:
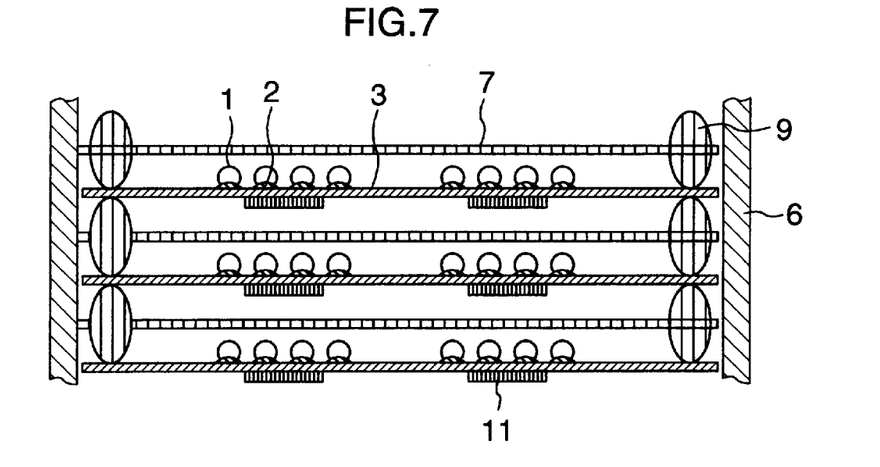
FIG. 7 is a sectional view showing a state in which the flexible printed circuit board after mounting of the solder balls is wound up together with the spacing tape onto a substrate takeup reel.

In the step c in FIG. 1, the flexible printed circuit board 3 having the solder balls 1 mounted thereon is wound up onto the substrate takeup reel 6 as shown in the next step d in FIG. 1 or as shown in FIG. 5. In this occasion, the spacing tape 7 is involved in the windings of the flexible printed circuit board 3 to prevent other members from coming into mechanical contact with the solder balls 1, that is, to prevent the solder balls 1 from being displaced from the pads 4 or prevent the solder balls 1 from dropping out of the pads 4. The spacing tape 7 is wound up on a spacing tape reel 8 in advance, so that the spacing tape 7 is fed out in synchronism with the rotation of the substrate takeup reel 6. FIG. 6 is a perspective view showing a part of the spacing tape 7. FIG. 7 is a partly sectional view taken along the A–B line in FIG. 5 and showing a state in which the flexible printed circuit board 3 having the solder balls 1 mounted thereon and the spacing tape 7 are wound up alternately on the substrate takeup reel 6. Thus, the spacing tape 7 has a width substantially equal to the width of the flexible printed circuit board 3, and has a large number of protrusions 9 formed on the opposite surfaces of the spacing tape 7 so as to be located in positions free from the solder balls 1 on the flexible printed circuit board 3, so that the spacing tape 7 has an "H"-shaped section, in the condition that the spacing tape 7 is put on the flexible printed circuit board 3. The height of the protrusions 9 is larger than the height of the solder balls 1 and larger than the quantity of projection from the surface of the flexible printed circuit board 3, of the semiconductor chips 11 bonded to the opposite surface of the flexible printed circuit board 3. Accordingly, the spacing tape 7 prevents other members from coming into contact with the solder balls 1 on the flexible printed circuit board 3. That is, the spacing tape 7 can prevent the solder balls 1 from being displaced from the pads 4 on the flexible printed circuit board 3 or from dropping out of the pads 4. Incidentally, inexpensive plastics, or the like, may be used sufficiently as the material for the spacing tape 7, and such a spacing tape 7 of plastics may be used repeatedly because the spacing tape 7 is not exposed to a high temperature. In the case where there is a fear of occurrence of static electricity, electrically conductive plastics may be used as the material for the spacing tape 7.

Figure 8:
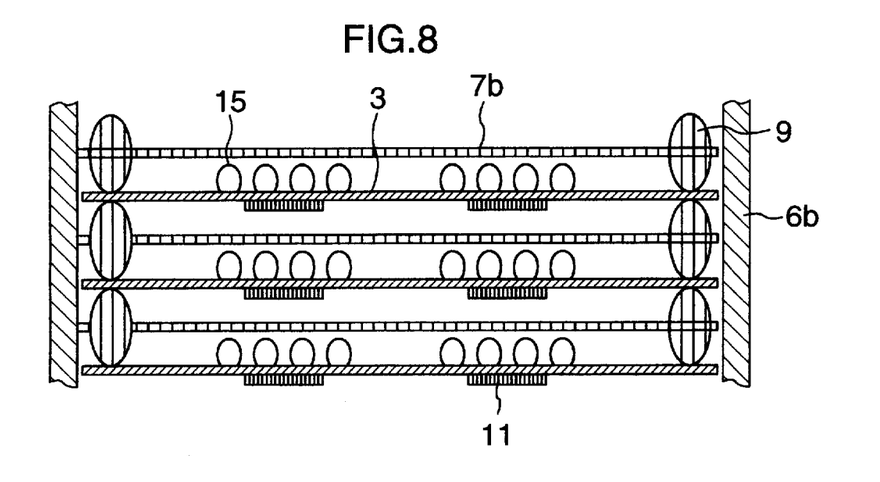
FIG. 8 is a sectional view showing a state in which the flexible printed circuit board after bump formation and the spacing tape are wound up onto the substrate takeup reel.
Figure 9:
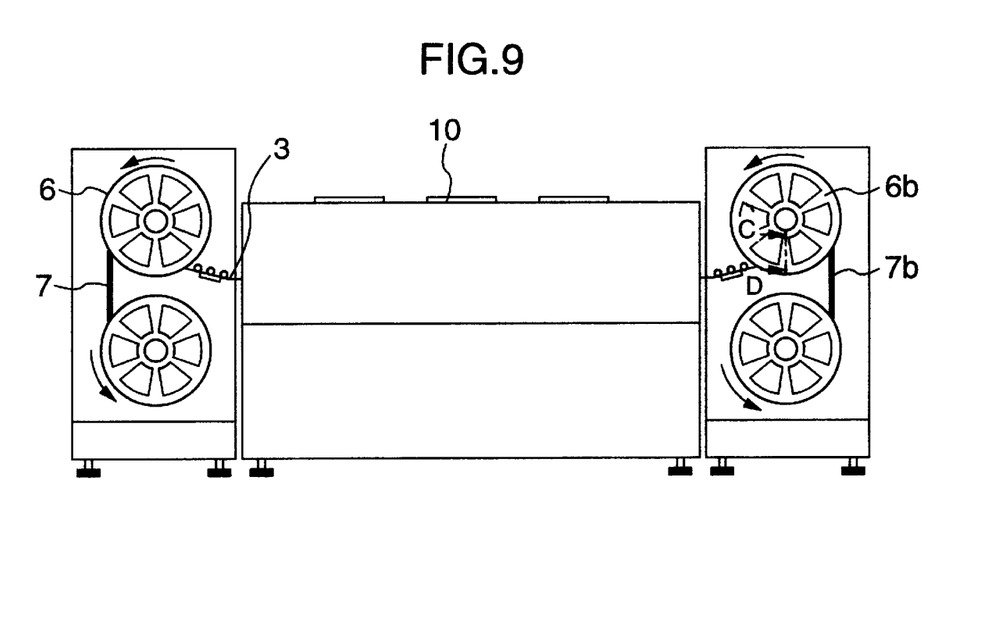
FIG. 9 is a view showing a method for forming bumps by heating the flexible printed circuit board having solder balls mounted thereon.

The flexible printed circuit board 3 wound up on the substrate takeup reel 6 in the step d in FIG. 1 is subsequently heated. In the heating step shown in FIG. 9, the flexible printed circuit board 3 is fed out from the substrate takeup reel 6 on which the flexible printed circuit board 3 and the spacing tape 7 are wound up after the solder balls 1 have been mounted, and the fed-out flexible printed circuit board 3 is led to a heating furnace such as a reflow furnace, or the like. In the heating furnace, the flexible printed circuit board 3 is heated so that the solder balls 1 are melted. Then, the flexible printed circuit board 3 is cooled so that the molten solder balls 1 are solidified to thereby form bumps. As shown in FIG. 9, when the flexible printed circuit board 3 is fed out from the substrate takeup reel 6, the spacing tape 7 wound up together with the flexible printed circuit board 3 on the substrate takeup reel 6 is taken up onto the spacing tape reel 8. The flexible printed circuit board 3 fed out from the heating furnace 10 after formation of the bumps may be wound up on the substrate takeup reel again or may be trimmed into pieces with a predetermined size, in accordance with the convenience of the succeeding steps. This embodiment shows the case where the flexible printed circuit board 3 is wound up on another substrate takeup reel 6b again as shown in the step f in FIG. 1 or as shown in FIG. 9. In the case where the damage of the thus formed bumps or the damage of the flexible printed circuit board 3 causes a problem, it is effective to use another spacing tape 7b when the flexible printed circuit board 3 is taken up on the substrate takeup reel 6b. FIG. 8 is a partly sectional view taken along the C–D line in FIG. 9 and showing a state in which the flexible printed circuit board 3 after formation of the bumps 15 is wound up on the other substrate takeup reel 6b after bump formation. The other spacing tape 7b is substantially equivalent to the spacing tape 7 used after the solder balls 1 have been mounted on the flexible printed circuit board 3, except that the height of protrusions 9 of this spacing tape 7b must be larger than the height of the formed bumps 15.

If necessary, the flexible printed circuit board 3 thus wound up is fed into a batch-type washing machine to remove the residue such as flux, etc., under the condition that the flexible printed circuit board 3 have been wound up on the substrate takeup reel 6b.

Alternatively, to cleanse the flexible printed circuit board 3 soon after the bumps have been formed by heating, a continuous washing machine available on the market may be placed just after the heating furnace 10 shown in FIG. 3. Further alternatively, the flexible printed circuit board 3 may be fed out from the substrate takeup reel 6, cleansed continuously and then wound up on the substrate takeup reel 6 again as shown in the steps f, g and h in FIG. 1. In these cases, the flexible printed circuit board 3 is trimmed into minimum pieces after cleansing.

It is thought of that the flexible printed circuit board after completion of bump formation is trimmed into minimum pieces before the residue such as flux, etc., is cleansed by a batch-type washing machine.

In this embodiment, there can be achieved a bump formation method in which the problems in conventional bump formation are solved so that the exclusive-use carrying jigs and the substrate trimming steps for bump formation are unnecessary for a tape-like LSI package substrate.

What is claimed is:

1. A method for forming bumps in an LSI package, comprising the steps of:

mounting semiconductor chips onto a flexible printed circuit board;

temporarily fixing electrically conductive balls by using fixing liquid comprising one selected from a group consisting of flux, solder paste and an adhesive containing an electrically conductive agent, onto pads which are provided on said flexible printed circuit board so as to be electrically connected to said semiconductor chips;

winding up said flexible printed circuit board having said electrically conductive balls temporarily fixed thereto, onto a reel;

forming bumps by feeding out said flexible printed circuit board having said electrically conductive balls temporarily fixed thereto from said reel, and heating said flexible printed circuit board;

winding up said flexible printed circuit board having said bumps formed thereon, onto another reel; and forming LSI packages by cleansing and trimming said flexible printed circuit board.

2. A bump formation method according to claim 1, wherein a spacer is involved in windings of said flexible printed circuit board when said flexible printed circuit board having said electrically conductive balls temporarily fixed thereto is wound up onto said reel.

3. A bump formation method according to claim 2, wherein said flexible printed circuit board and said spacer are separated from said reel so that said flexible printed circuit board is fed to the heating step.

4. A bump formation method according to claim 3, wherein said flexible printed circuit board is wound up onto said other reel after the heating step.

5. A bump formation method according to claim 4, wherein another spacer is involved in windings of said flexible printed circuit board when said flexible printed circuit board is wound up onto said other reel after the heating step.

6. A bump formation method according to claim 4, wherein said flexible printed circuit board is cleansed before said flexible printed circuit board is wound up onto said other reel after the heating step.

7. A bump formation method according to claim 4, wherein said flexible printed circuit board is cleansed under the condition that said flexible printed circuit board has been wound up on said other reel after the heating step.

8. A bump formation method according to claim 3, wherein said flexible printed circuit board is trimmed into minimum pieces after the heating step.

9. A bump formation method according to claim 8, wherein said flexible printed circuit board is cleansed after said flexible printed circuit board is trimmed.

10. A bump formation method according to claim 2, wherein said spacer is substantially shaped like "H" in sectional view so that a depth of concave portions opposite to electrically conductive particles is selected to be not smaller than a diameter of the electrically conductive balls.

11. A bump formation method according to claim 5, wherein said spacer is substantially shaped like "H" in sectional view so that a depth of concave portions opposite to said bumps formed in the heating step is selected to be not smaller than a height of said bumps.

* * * * *